United States Patent
Youn et al.

(10) Patent No.: US 7,767,501 B2
(45) Date of Patent: Aug. 3, 2010

(54) DEVICES USING ABRUPT METAL-INSULATOR TRANSITION LAYER AND METHOD OF FABRICATING THE DEVICE

(75) Inventors: Doo-Hyeb Youn, Daejeon (KR); Hyun-Tak Kim, Daejeon (KR); Byung-Gyu Chae, Daejeon (KR); Sung-Lyul Maeng, Cheongju (KR); Kwang-Yong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 441 days.

(21) Appl. No.: 11/721,069

(22) PCT Filed: Dec. 5, 2005

(86) PCT No.: PCT/KR2005/004116

§ 371 (c)(1),
(2), (4) Date: Jun. 7, 2007

(87) PCT Pub. No.: WO2006/062317

PCT Pub. Date: Jun. 15, 2006

(65) Prior Publication Data

US 2009/0230428 A1      Sep. 17, 2009

(51) Int. Cl.
   *H01L 21/335* (2006.01)
(52) U.S. Cl. .................... 438/142; 438/85; 438/86; 438/95; 438/99; 438/104; 257/192; 257/194; 257/410; 257/431; 257/458; 257/E21.693
(58) Field of Classification Search .............. 438/86; 257/61, 455
See application file for complete search history.

(56) References Cited

U.S. PATENT DOCUMENTS

| | | | |
|---|---|---|---|
| 6,130,446 A | 10/2000 | Takeuchi et al. | |
| 6,392,262 B1 | 5/2002 | Shiraishi | |
| 6,624,463 B2 * | 9/2003 | Kim et al. | 257/310 |

FOREIGN PATENT DOCUMENTS

| | | |
|---|---|---|
| KR | 2000 11528 | 2/2000 |
| KR | 2003 24156 | 3/2003 |
| WO | WO2005 041308 | 5/2005 |

OTHER PUBLICATIONS

Rovimov, S. et al, "Microstructure of Ti/Al/Ni/Au Ohmic Contacts for n-GaN", Sep. 9, 1996, *Applied Physics Letters*, vol. 69, No. 11.
Sheu, J.K et al, "The Effect of Thermal Annealing on the Ni/Au Contact of p-Type GaN", Mar. 15, 1998, *Journal of Applied Physics*, vol. 83, No. 6.

* cited by examiner

*Primary Examiner*—N Drew Richards
*Assistant Examiner*—Kyoung Lee
(74) *Attorney, Agent, or Firm*—Ladas & Parry LLP

(57) ABSTRACT

The abrupt metal-insulator transition device includes: an abrupt metal insulator transition material layer including an energy gap of less than or equal to 2 eV and holes within a hole level; and two electrodes contacting the abrupt metal-insulator transition material layer. Here, each of the two electrodes is formed by thermally treating a stack layer of a first layer formed on the abrupt metal-insulator transition material layer and comprising Ni or Cr, a second layer formed on the first layer and comprising In, a third layer formed on the second layer and comprising Mo or W, and a fourth layer formed on the third layer and comprising Au.

20 Claims, 11 Drawing Sheets

DEVICES USING ABRUPT METAL-INSULATOR TRANSITION LAYER AND METHOD OF FABRICATING THE DEVICE

TECHNICAL FIELD

The present invention relates generally to a device using an abrupt metal-insulator transition layer and a method of fabricating the device, and more particularly to an abrupt metal-insulator transition device having improved electrodes and a method of fabricating the device.

BACKGROUND ART

Memory devices using phase change materials (PCMs) have become an active research and development issue. Since the structural phase changes of the crystalline and amorphous phases occur at a high temperature in PCMs, PCMs may be used for memory devices. However, PCMs are not used in other fields, for example, for switching devices. This is because the fast switching speed cannot be achieved by PCMs due to a position change of atom caused by the structural phase change.

Mott-Hubbard field effect transistors (FETs) use Mott-Hubbard insulators as channel layers and were suggested as an example of switching devices using phase changes by D. M. Newns et al. [Appl. Phys. Lett. 73 (1998) 780]. Mott-Hubbard FETs are turned on and/or off according to a metal-insulator transition and do not include depletion regions, unlike general MOSFETs. Thus, the Mott-Hubbard FETs show a higher speed switching characteristic than the general MOSFETs, and integration thereof can be greatly improved. However, since the Mott-Hubbard FETs use a continuous metal-insulator transition, the carrier electric charge must be continuously added until the Mott-Hubbard FETs show the best metallic characteristics. Thus, the added electric charge will add up to a high density. As a result, either a dielectric constant of the gate insulating layer in a Mott-Hubbard FET must be large, or a thickness of the gate insulating layer must be thin, or a gate voltage applied must be large. However, if the dielectric constant is too large, the dielectric is sharply deteriorated during a high switching operation, and this will lead to shortening of the transistor lifespan. It is difficult to make the thickness of the gate insulating layer thin due to process limitations. If the gate voltage is increased, the power consumption is also increased, and this will cause the transistor unsuitable for low power applications.

U.S. Pat. No. 6,624,463 discloses an abrupt metal-insulator transition device using an abrupt metal-insulator transition material in an attempt to solve the above-described problems. The abrupt metal-insulator transition material adds low density holes to a Mott-Brinkman-Reiss insulator so that a transition from an insulator state to a metal state occurs not continuously but abruptly. The hole-driven metal-insulator transition theory was suggested by Hyun-Tak Kim in the paper 'New Trends in Superconductivity' [NATO Science Series Vol II/67 (Kluwer, 2002) p137]' and http://xxx.lan-l.gow/abs/cond-mat/0110112. Since the density of the added holes is very low, the problems of FETs using metal-insulator transition materials can be solved.

However, when a metal-insulator phase change occurs in an abrupt metal-insulator transition device, a great current flows abruptly between source and drain electrodes and thus a high temperature exothermic operation occurs.

Figure 1:
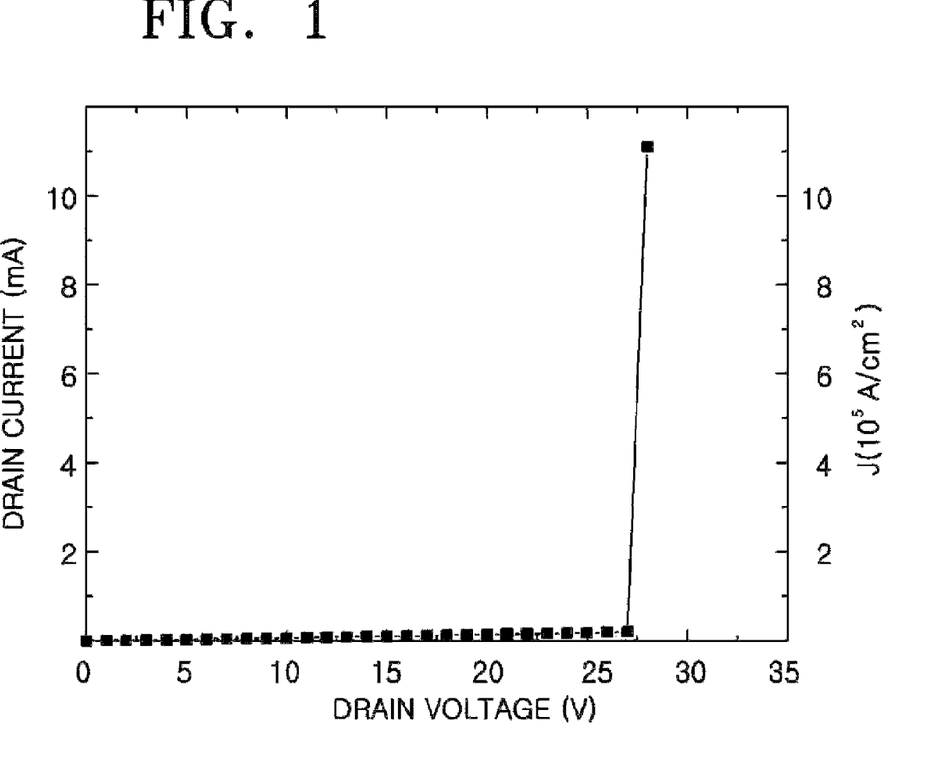
FIG. 1 is a graph for illustrating I-V characteristics of an abrupt metal-insulator transition device.

FIG. 1 is a graph illustrating current (I)-voltage (V) characteristics of an abrupt metal-insulator transition device. Referring to FIG. 1, a great drain current flows abruptly at a drain voltage of about 27V. When a gap between source and drain electrodes is about 5 μm, and a line width of a gate electrode is 25 μcm, a density of a current flowing between the source and drain electrodes is about 5×10E5 A/cm2. Thus, a very large current flows between the source and drain electrodes, and the device is heated via Joule heating.

Figure 2:
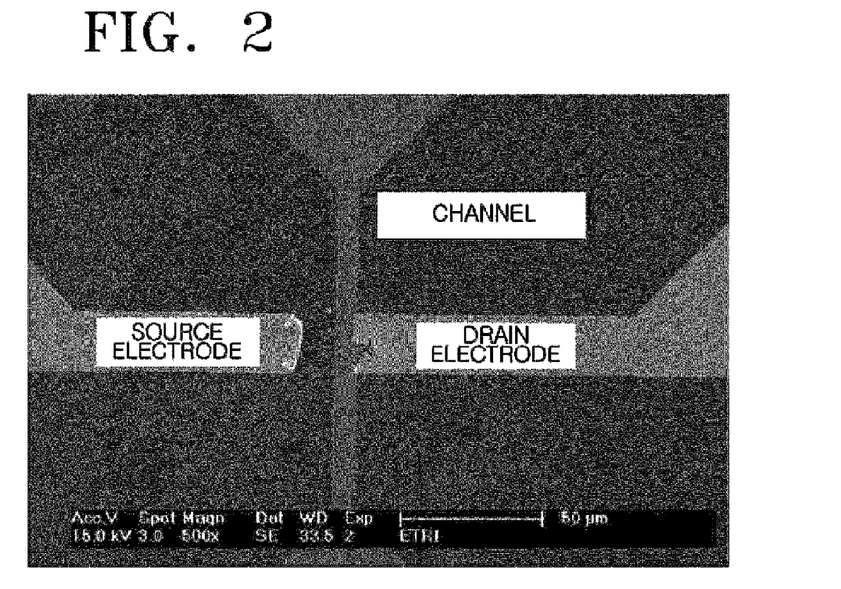
FIG. 2 is a scanning electron microscope (SEM) photo showing a breakdown of source and drain electrodes due to the deterioration of an abrupt metal-insulator transition device.

In a current abrupt metal-insulator transition device, Cr/Au is used as the source and drain electrodes. However, Cr/Au cannot sustain a high current density and is thermally degraded. Thus, as shown in FIG. 2, the source and drain electrodes above a channel are broken down. As a result, the characteristic of the abrupt metal-insulator transition device is deteriorated. In a case of serious deterioration, the abrupt metal-insulator transition device cannot be used any more.

DISCLOSURE OF INVENTION

Technical Problem

The present invention provides an abrupt metal-insulator transition device having electrodes that do not break during a high power operation and a method of fabricating the device.

Technical Solution

According to an aspect of the present invention, there is provided an abrupt metal-insulator transition device including: an abrupt metal-insulator transition material layer having an energy gap of less than or equal to 2 eV and holes within a hole level; and two electrodes contacting the abrupt metal-insulator transition material layer. Each of the two electrodes is formed by thermally treating a stack layer of a first layer formed on the abrupt metal-insulator transition material layer and including Ni or Cr, a second layer formed on the first layer and including In, a third layer formed on the second layer and including Mo or W, and a fourth layer formed on the third layer and including Au.

The abrupt metal-insulator transition device may be embodied as a 2-terminal switching device. A first electrode of the two electrodes may be disposed on a lower surface of the abrupt metal-insulator transition material layer, and a second electrode of the two electrodes may be disposed on an upper surface of the abrupt metal-insulator transition material layer. Thus, the abrupt metal-insulator transition device may have a vertical structure in which a current flows in a vertical direction with respect to a substrate. Alternatively, the two electrodes may be disposed on the abrupt metal-insulator transition material layer so as to face each other and to be spaced apart from each other. Thus, the abrupt metal-insulator transition device may have a horizontal structure in which the current flows in a horizontal direction with respect to the substrate.

The abrupt metal-insulator transition device may be embodied as a 3-terminal switching device. The abrupt metal-insulator transition device may further include: a gate insulating layer formed on the two electrodes; and another electrode formed on the gate insulating layer and disposed on the abrupt metal-insulator transition material layer between the two electrodes. The another electrode may be formed on the gate insulating layer by thermally treating a stack layer of a first layer formed on the gate insulating layer and comprising Ni or Cr, a second layer formed on the first layer and comprising In, a third layer formed on the second layer and comprising Mo or W, and a fourth layer formed on the third layer and comprising Au.

According to another aspect of the present invention, there is provided a 2-terminal switching device using a GaAs layer as an abrupt metal-insulator transition material layer. Electrodes of the 2-terminal switching device may be formed by thermally treating stack layers of Ni, In, Mo, and Au. An intermediate layer may be formed between the electrodes and the abrupt metal-insulator transition material layer. The intermediate layer may be formed through an interfacial reaction caused by thermal treating.

According to still another aspect of the present invention, there is provided a method of fabricating an abrupt metal-insulator transition device, including: forming an abrupt metal-insulator transition material layer having an energy gap of less than or equal to 2 eV and holes within a hole level; and forming two electrodes contacting the abrupt metal-insulator transition material layer. The Forming of the two electrodes may include: forming stack layers of first layers formed of Ni or Cr on the abrupt metal-insulator transition material layer, second layers formed of In on the first layers, third layers formed of Mo or W on the second layers, and fourth layers formed of Au on the third layers; and thermally treating the stack layers.

The method may further include: reacting an interface between the first layers of the stack layers and the abrupt metal-insulator transition material layer.

The method may further include: reacting the second layers of the stack layers and the abrupt metal-insulator transition material layer to form an intermediate layer including a smaller band gap than the abrupt metal-insulator transition material layer between the two electrodes and the abrupt metal-insulator transition material layer.

The first, second, third, and fourth layers may be formed using e-beam evaporation. The method may further include: patterning the stack layers using a lift-off process to obtain desired electrode patterns. The abrupt metal-insulator transition material layer may be formed of a GaAs layer. The GaAs layer may be formed using a molecular beam epitaxy crystal growing method.

As described above, an abrupt metal-insulator transition device according to the present invention includes electrodes formed of stack layers of Ni (Cr), In, Mo (or W), and Au. The electrodes may have low contact resistances, improve current inflow efficiency, and be prevented from being thermally deteriorated due to a high temperature exothermic reaction during driving of a high power device. In the abrupt metal-insulator transition device having such electrodes, the electrodes are not break down. Also, the characteristic of the abrupt metal-insulator transition device is not deteriorated due to the breakdown of the electrodes. In addition, the abrupt metal-insulator transition device has high reliability.

Advantageous Effects

The abrupt metal-insulator transition device according to the present invention includes electrodes formed of stack layers of Ni (or Cr), In, Mo (or W), and Au. Thus, the electrodes have low resistance, high pressure characteristics.

In other words, such electrodes have low contact resistances. Thus, current inflow efficiency can be improved. A current gain of the abrupt metal-insulator transition device including the electrodes is high. Also, the electrodes can be prevented from being thermally deteriorated due to high temperature exothermic reaction during driving of a high power device. Thus, the abrupt metal-insulator transition device including the electrodes is thermally stable.

DESCRIPTION OF DRAWINGS

The above and other features and advantages of the present invention will become more apparent by describing in detail exemplary embodiments thereof with reference to the attached drawings in which.

MODE FOR INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

Figure 3:
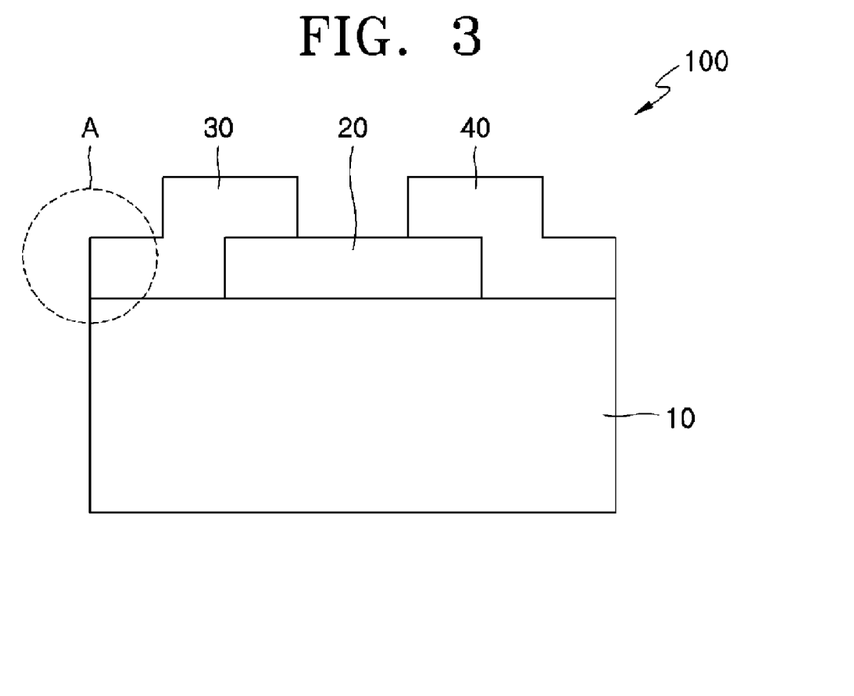
FIG. 3 is a cross-sectional view of an abrupt metal-insulator transition device according to an embodiment of the present invention.

FIG. 3 is a cross-sectional view of an abrupt metal-insulator transition device 100 according to an embodiment of the present invention. The abrupt metal-insulator transition device 100 is embodied as a 2-terminal switching device having a horizontal structure.

Referring to FIG. 3, an abrupt metal-insulator transition material layer 20 is formed on a substrate 10. Here, the abrupt metal-insulator transition material layer 20 may be disposed on a portion of a surface of the substrate 10. A buffer layer (not shown) may be further disposed between the substrate 10 and the abrupt metal-insulator transition material layer 20. The buffer layer may be disposed on the whole surface of the substrate 10.

The abrupt metal-insulator transition material layer 20 has an energy gap of 2 eV or less and is formed of a material having holes within a hole level. The abrupt metal-insulator transition material layer 20 may be formed of a GaAs layer, i.e., a p-type GaAs layer. Here, the substrate 10 may be a semi-insulating substrate such as a p-type GaAs.

In the present invention, the abrupt metal-insulator transition material layer 20 means a thin film formed of a material generating an abrupt metal-insulator transition during an addition of low density holes. For example, the abrupt metal-insulator transition material layer 20 may a p-type semiconductor including low density holes, a p-type oxide semiconductor including low density holes, a p-type inorganic compound semiconductor including low density holes including III-V-group and II-VI-group semiconductor elements, transition metal elements, and rare-earth elements, lanthanum-group elements, a p-type organic semiconductor including low density holes, or an insulator. Here, the low density is considered according to the Mott's criterion, and a hole density n is given about $(0.2/aH)^3$ where aH Bohr radius of a corresponding material. As an example, the hole density n is about 0.0018%, i.e., about $n=3\times10^{18}$ cm-3, with respect to VO2 having an energy gap of 0.6 eV and a hole level. As another example, the hole density n is about 0.001%, i.e., $n=1\times10E14$ cm-3, with respect to a p-type GaAs having an energy gap of about 1.45 eV and a hole level.

The substrate 10 for forming the abrupt metal-insulator transition material layer 20 is not specially limited. For example, the substrate 10 may be Si, SiO2, GaAs, Al2O3, plastic, glass, V2O5, PrBa2Cu3O7, YBa2Cu3O7, MgO, SrTiO3, SrTiO3 doped with Nb, or a silicon on insulator (SOI) substrate. The buffer layer is disposed so as to well grow the abrupt metal-insulator transition material layer 20 from the substrate 10 and may be omitted. The buffer layer is formed of a material achieving lattice matching between the substrate 10 and the abrupt metal-insulator transition material layer 20, for example, SiO2, Si3N4, or the like.

The abrupt metal-insulator transition material layer 20 contacts two electrodes, for example, first and second electrodes, i.e., source and drain electrodes 30 and 40. The source and drain electrodes 30 and 40 are disposed on the abrupt metal-insulator transition material layer 20 so as to be separated from each other at a predetermined distance, i.e., by a channel length.

Figure 4:
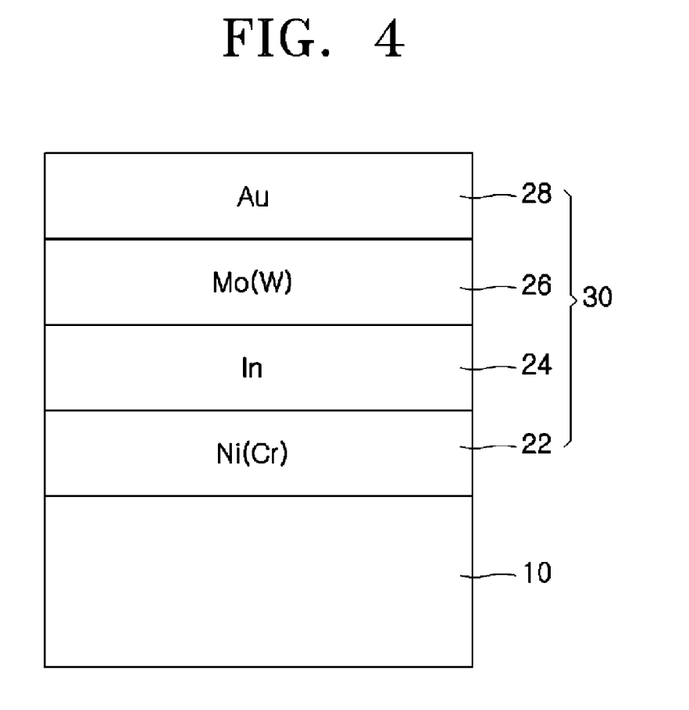
FIG. 4 is an enlarged view of portion A shown in FIG. 3.

The source and drain electrodes 30 and 40 are respectively formed by thermally treating stack layers as shown in FIG. 4. FIG. 4 shows only an enlarged view of the source electrode 30, but the drain electrode 40 also has the same structure as the source electrode 30.

Referring to FIG. 4, a set of stacked layers of first, second, third, and fourth layers 22, 24, 26, and 28 is thermally treated to form the source electrode 30. The first layer 22 of Ni or Cr is formed on the substrate 10 and also on the abrupt metal-insulator transition material layer 20. The second layer 24 of In is formed on the first layer 22.

The third layer 26 of Mo or W is formed on the second layer 24. The fourth layer 28 of Au is formed on the third layer 26. The stacked layer, for example, may be Ni/In/Mo/Au with the Ni layer formed on the substrate 10.

Functions of Ni (or Cr)/In/Mo (or W)/Au metal layers constituting the source and drain electrodes 30 and 40 will now be described.

The first layer 22 including Ni (or Cr) is adopted to lower a contact resistance and thus is a first metal layer contacting the abrupt metal-insulator transition material layer 20 formed of GaAs, i.e., a metal layer for an ohmic contact. Also, the first layer 22 may be a reactive material layer inducing an interface reaction between a metal and a GaAs layer in a high thermal treating process for obtaining an ohmic contact after depositing the metal. When the first layer 22 including Ni (or Cr) is deposited, thermal diffusion is possible between the source and drain electrodes 30 and 40 and the surface of the abrupt metal-insulator transition material layer 20 formed of GaAs. A NiGa compound having a high thermal reaction temperature, i.e., a high melting point, is formed through the interface reaction so that the abrupt metal-insulator transition device thermally stably operates at a high temperature.

The second layer 24 including In is a second metal layer formed on the first layer 22 contacting the abrupt metal-insulator transition material layer 20 formed of GaAs, i.e., a metal layer for an ohmic contact. The second layer 24 diffuses toward the abrupt metal-insulator transition material layer 20 formed of GaAs beneath the first layer 22 in a high thermal treating process to generate an interface reaction with a GaAs layer having a great band gap so as to form an InGaAs layer having a smaller band gap than the GaAs layer between the abrupt metal-insulator transition material 20 and the respective one of the source and drain electrodes 30 and 40. Thus, a potential barrier between the GaAs layer and the respective one of the source and drain electrodes 30 and 40 may be lowered so as to maximize the characteristic of the abrupt metal-insulator transition device.

In other words, In generates a new compound having a band gap between the metal layer and the GaAs layer to lower the potential barrier so as to increase the current inflow efficiency. In general, when a device using a compound semiconductor such as GaAs is fabricated, a band gap offset, i.e., a potential barrier, exists between a GaAs layer having a great band gap and an electrode formed for an inflow of a current. In a case where the current flows in to operate the abrupt metal-insulator transition device, the current does not smoothly flow in due to the potential barrier, and a great voltage-drop occurs between the GaAs layer and the electrode. Thus, the drive voltage of the abrupt metal-insulator transition device is increased. As a result, operation efficiency of the abrupt metal-insulator transition device using the compound semiconductor such as GaAs is lowered.

However, if the second layer 24 including In is used as in an embodiment of the present invention, a InGaAs layer having a smaller band gap than the GaAs layer is formed to lower the potential barrier. Thus, a current smoothly flows into the abrupt metal-insulator transition device. Great voltage consumption does not occur between the abrupt metal-insulator transition material layer 20 and the respective one of the source and drain electrodes 30 and 40. As described above, each of the source and d rain electrodes 30 and 40 of the abrupt metal-insulator transition device according to an embodiment of the present invention includes the second layer 24 including In.

Thus, an intermediate layer (not shown) having a smaller band gap than the abrupt metal-insulator transition material layer 20 may be further formed between the respective one of the source and drain electrodes 30 and 40 and the abrupt metal-insulator transition material layer 20.

The third layer 26 including Mo (or W) is a third metal layer of the source electrode 30 contacting the abrupt metal-insulator transition material layer 20 formed of GaAs. Mo (or W) is introduced between In of the second layer 24 and Au of the fourth layer 28 to prevent an ohmic characteristic resistance caused by thermal diffusion of Au in a high temperature operation process during driving of a high power device. Also, Mo (or W) has a high melting point so as to prevent electrodes from breaking down due to thermal deterioration during the driving of the high power device.

The fourth layer 28 including Au is a fourth metal layer of the source electrode 30 contacting the abrupt metal-insulator transition material layer 20 formed of GaAs. Au is deposited on the uppermost layer of materials of the electrodes for wire bonding. Au basically has lower current inflow efficiency with respect to the GaAs layer, i.e., a schottky characteristic. However, in a case where Au flows toward Ni and In having ohmic characteristics due to thermal diffusion in a high temperature treating process, a low resistance characteristic occurs. Thus, the ohmic characteristic is deteriorated. As previously described, the third layer 26 prevents such thermal diffusion.

As described above, in the present invention, a low resistance ohmic contact can be obtained due to band gap re-engineering. Also, stable ohmic electrodes, which do not deform due to thermal deterioration even during operation at a high temperature, can be formed.

The operation of the abrupt metal-insulator transition device 100 having the above-described structure will now be described with reference to FIG. 3. When a bias having a predetermined magnitude is applied to the source and drain electrodes 30 and 40, an electric field having a predetermined magnitude is formed at both ends of the abrupt metal-insulator transition material layer 20 between the source and drain electrodes 30 and 40. Hole doping occurs due to the electric field, i.e., holes within a hole level inside the abrupt metal-insulator transition material layer 20 are injected to a valence band. As the hole doping occurs, the abrupt metal-insulator transition material layer 20 transits from an insulator state to a metal state. As a result, a large amount of current flows between the source and drain electrodes 30 and 40.

However, in the source and drain electrodes 30 and 40 of the abrupt metal-insulator transition device 100 according to an embodiment of the present invention, the third layer 26 including Mo (or W) having the high melting point for preventing the source and drain electrodes 30 and 40 from being broken down is introduced between the first layer 22 including Ni (or Cr) for the ohmic contact and the second layer 24 including In and the fourth layer 28 including Au for the wire bonding. Thus, low resistance characteristics of lower layers such as Ni, In, and the like are not lowered and deteriorated due to the thermal diffusion of Au even during high current, high power operation.

A method of fabricating the abrupt metal-insulator transition device 100 that is a 2-terminal switching device having a horizontal structure will now be described with reference to FIGS. 5 through 7.

Figure 5:
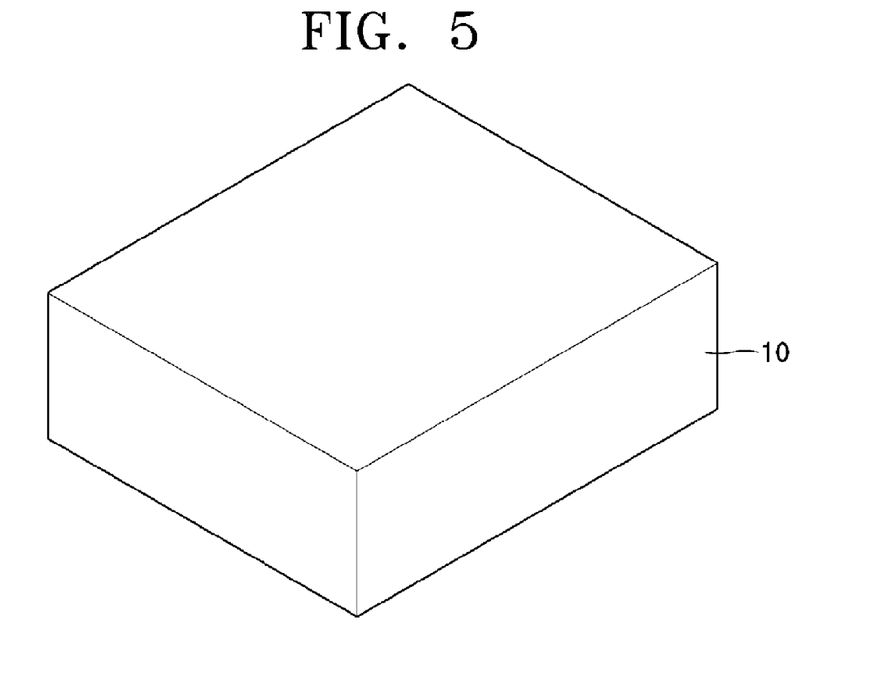
FIGS. 5 through 7 are perspective views for illustrating a method of fabricating an abrupt metal-insulator transition device according to an embodiment of the present invention.

As shown in FIG. 5, the substrate 10, preferably, a p-type GaAs substrate, is provided.

Figure 6:
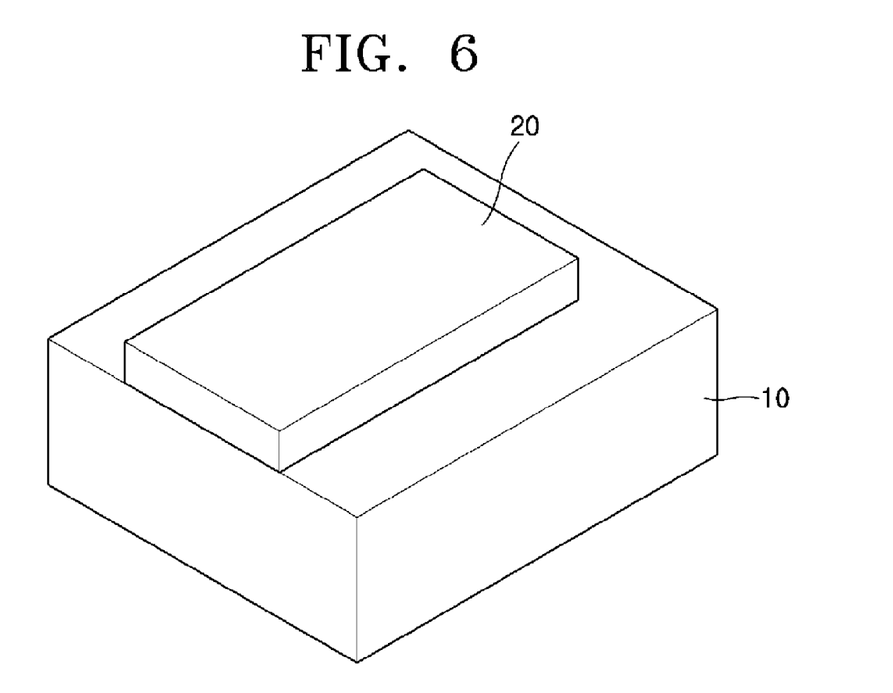

As shown in FIG. 6, an abrupt metal-insulator transition semiconductor material, preferably, a p-type GaAs layer, is deposited and patterned on the substrate 10 to form the abrupt metal-insulator transition material layer 20. The GaAs layer may be deposited using an MBE crystal growing method. A photoresist layer is coated on the GaAs layer using a spin-coater and then patterned according to a photolithography process using a Cr mask. An RF-ion milling method may be used as an etching method. The abrupt metal-insulator transition material layer 20 isolated as shown in FIG. 6 may be formed through such a patterning process. Here, a buffer layer may be formed before the abrupt metal-insulator transition semiconductor material is deposited on the substrate 10.

Figure 7:
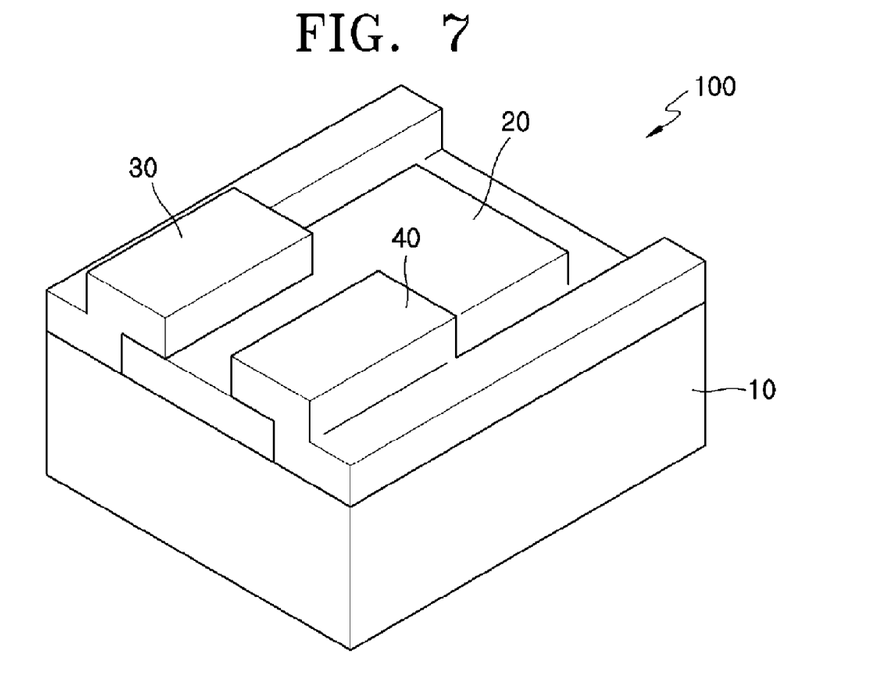

As shown in FIG. 7, the source and drain electrodes 30 and 40 are formed on the abrupt metal-insulator transition material layer 20 so as to be spaced apart from each other and face each other. For this purpose, as described with reference to FIG. 4, a set of stack layers of first, second, third, and fourth layers 22, 24, 26, 28 respectively including Ni or Cr, In, Mo or W, and Au is formed. The first through fourth layers 22, 24, 26, 28 are respectively deposited using an e-beam evaporation method. Thereafter, the first through fourth layers 22, 24, 26, 28 are patterned using a lift-off process to expose a portion of a surface of the abrupt metal-insulator transition material layer 20 to be used a channel area. Next, the source and drain electrodes 30 and 40 are formed beside both sides of the exposed portion so as to be spaced apart from each other and face each other. High temperature treating for an ohmic contact is performed to induce a necessary interface reaction.

Figure 8:
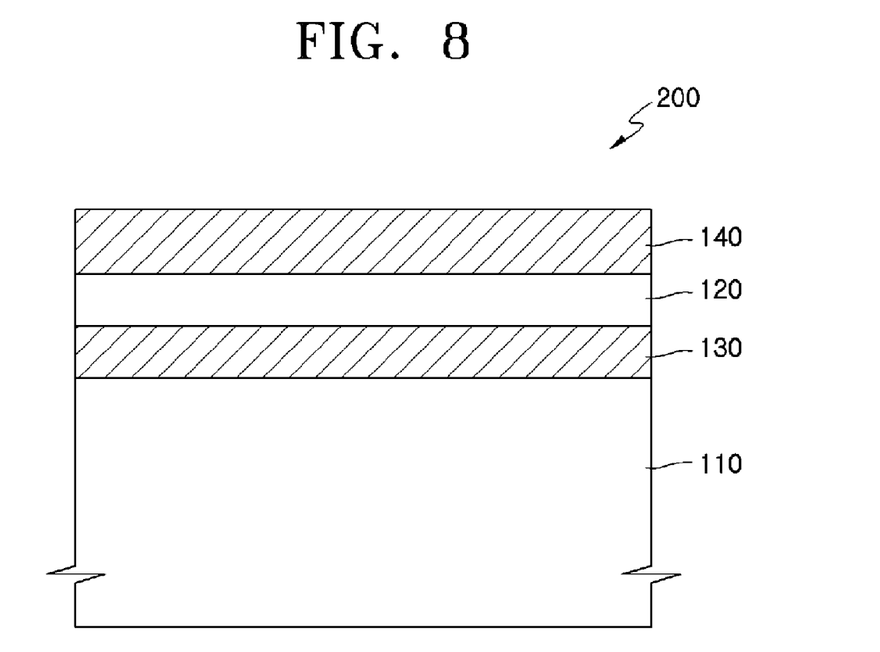
FIG. 8 is a cross-sectional view of an abrupt metal-insulator transition device according to an embodiment of the present invention.

FIG. 8 is a cross-sectional view of an abrupt metal-insulator transition device 200 according to another embodiment of the present invention. Here, the abrupt metal-insulator transition device 200 is embodied as a 2-terminal switching device. Referring to FIG. 8, a first electrode 130, an abrupt metal-insulator transition material layer 120, and a second electrode 140 are sequentially stacked on a substrate 110. In other words, the first electrode 130 of the two electrodes, for example, a source electrode, is disposed on a lower surface of the abrupt metal-insulator transition material layer 120, and the second electrode 140, for example, a drain electrode, is disposed on an upper surface of the abrupt metal-insulator transition material layer 120.

The abrupt metal-insulator transition device 200 is the same as the abrupt metal-insulator transition device 100 having the horizontal structure described with reference to FIGS. 3 through 7 except that the abrupt metal-insulator transition material layer 130 transits to a metal state, and thus a current flows in a vertical direction with respect to the substrate 110. The abrupt metal-insulator transition device 200 is also the same as the abrupt metal-insulator transition device 100 in terms of a fabrication method except for the order of stacking the first electrode 130, the abrupt metal-insulator transition material layer 120, and the second electrode 140.

Figure 9:
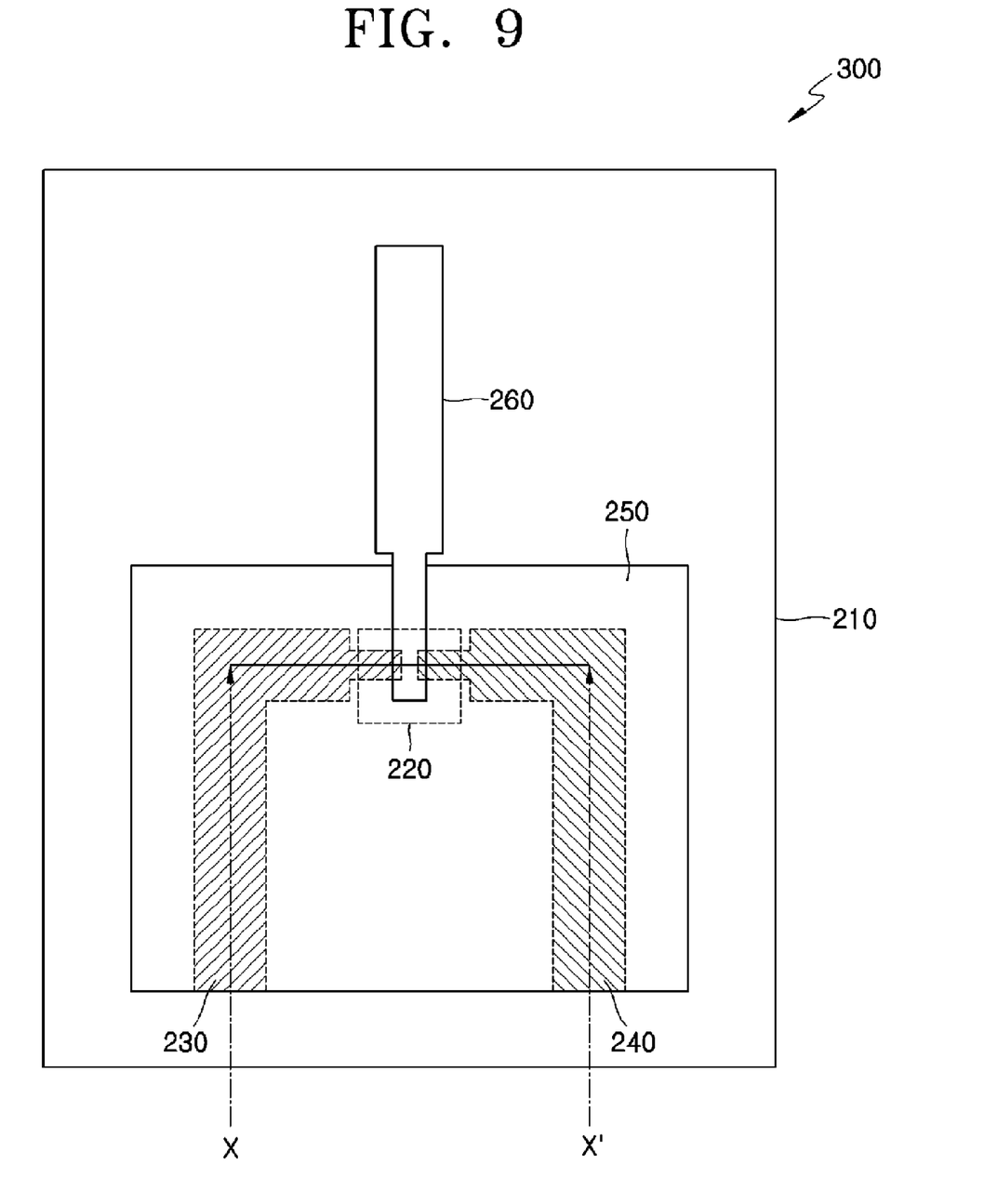
FIG. 9 is a layout of an abrupt metal-insulator transition device according to an embodiment of the present invention.
Figure 10:
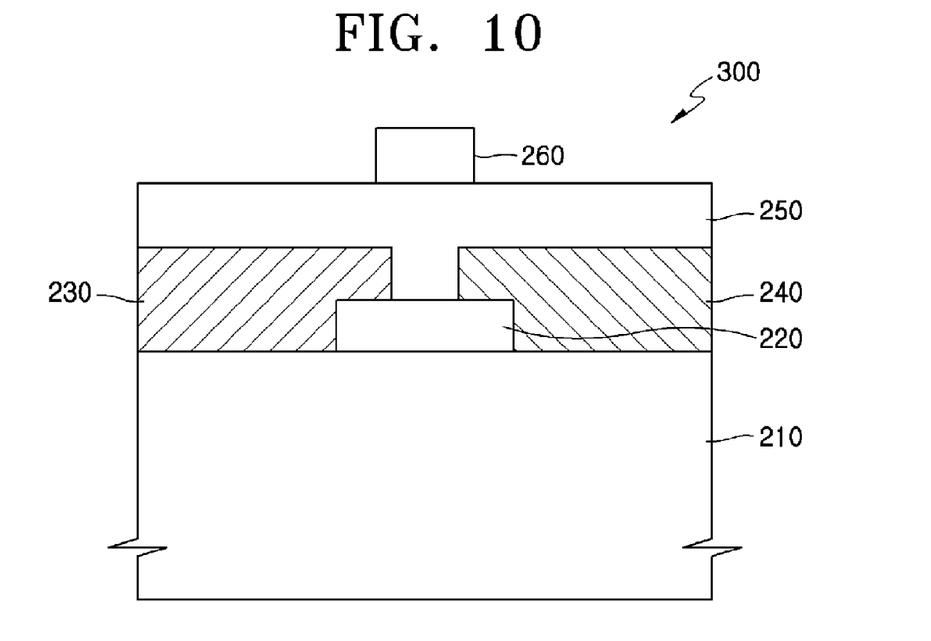
FIG. 10 is a cross-sectional view taken along line X-X' shown in FIG. 9.

FIG. 9 is a layout of an abrupt metal-insulator transition device 300 according to still another embodiment of the present invention, and FIG. 10 is a cross-sectional view taken along line X-X' of FIG. 9. In the present embodiment, the abrupt metal-insulator transition device 300 is a 3-terminal switching device.

Referring to FIGS. 9 and 10, an abrupt metal-insulator transition material layer 220 is formed on a substrate 210. As shown in FIG. 9, the abrupt metal-insulator transition material layer 220 may be disposed in a square shape on a portion of a surface of the substrate 210. Two electrodes, for example, first and second electrodes, i.e., source and drain electrodes 230 and 240, contact the abrupt metal-insulator transition material layer 220. The source and drain electrodes 230 and 240 are disposed on the abrupt metal-insulator transition material layer 220 at a predetermined distance, i.e., by a channel length.

The source electrode 230 is adhered to the left side of the abrupt metal-insulator transition material layer 220 and a portion of a surface of the abrupt metal-insulator transition material layer 220. The drain electrode 240 is adhered to the right side of the abrupt metal-insulator transition material layer 220 and a portion of the surface of the abrupt metal-insulator transition material layer 220.

The structures of the abrupt metal-insulator transition material layer 220, the source electrode 230, and the drain electrode 240 and methods of forming the abrupt metal-insulator transition material layer 220, the source electrode 230, and the drain electrode 240 are the same as or similar to those of the abrupt metal-insulator transition material layer 20, the source electrode 30, and the drain electrode 40 of the abrupt metal-insulator transition device 100.

As shown in FIG. 10, a gate insulating layer 250 is formed on the source and drain electrodes 230 and 240, the abrupt metal-insulator transition material layer 220, and a portion of the surface of the substrate 210. The gate insulating layer 250 may be a Ba0.5Sr0.5TiO3(BST) dielectric layer having a dielectric constant of about 43 but is not limited to this. The gate insulating layer 250 may be another dielectric layer instead of the BST dielectric layer, for example, a high dielectric constant dielectric layer such as Ta2O5 or a gate insulating layer having a general insulating characteristic such as Si3N4, SiO2 dielectric layers. Another electrode, i.e., a gate electrode 260, is formed on the gate insulating layer 250. To form the gate insulating layer 260, a stack layer of first, second, third, and fourth layers respectively including Ni (or Cr), In, Mo (or W), and Au may be thermally treated. A method of forming the gate electrode 260 is the same as a method of forming the source and drain electrodes 230 and 240. In other words, a method of forming the source and drain electrodes 30 and 40 used in the previous embodiment may be used in the present embodiment.

As described above, an abrupt metal-insulator transition device may be embodied as various types of devices such as a-2 terminal switching device having a horizontal structure, a 2-terminal switching device having a vertical structure, and a 3-terminal switching device and include at least two electrodes formed of stack layers of Ni (or Cr), In, Mo (or W), and Au. The two electrodes can have low contact resistances, improve inflow efficiency of a current, and be prevented from thermally deteriorating due to a high temperature exothermic reaction during driving of a high power device. Thus, the two electrodes can be protected from breaking down and have high reliability.

The some aspects of the present invention will be described in detail below through the following experimental results as examples, which are not intended to limit the scope of the present invention. It will be clear that the present invention is well adapted to attain the ends and advantages mentioned above and below with respect to the experiments as well as those inherent therein. While a various embodiments including the presently preferred one has been described for purposes of this disclosure, various changes and modifications may be made, which are well within the scope of the present invention. Numerous other changes may be made which will readily suggest themselves to those skilled in the art and which are encompassed in the spirit of the invention disclosed.

In this experiment, a 2-terminal switching device having a horizontal structure as described with reference to FIGS. 3 through 7 was fabricated.

A p-type GaAs substrate is provided as the substrate 10, and a p-type GaAs layer as the abrupt metal-insulator transition material layer 20 is grown from the substrate 10 to a thickness of 350 nm using the MBE crystal growing method. Next, the p-type GaAs layer is etched using an RF-ion milling method to form an isolation area. Ni, In, Mo, and Au thin films as the first, second, third, and fourth layers 22, 24, 26, and 28 respectively having thicknesses of 25 nm, 20 nm, 50 nm, and 200 nm were deposited using the e-beam evaporation method and then formed as source and drain electrode patterns using the lift-off process. Here, a length and a width of a channel were 5 um and 10 um, respectively.

In the device fabricated through the above processes, a voltage is applied to a GaAs layer (such as 20) that is a channel layer so that a current flows in the channel layer. Thus, holes are induced inside the GaAs layer. Here, an abrupt metal-insulator transition occurs in the GaAs layer, and thus the GaAs layer transits to a metal state. As a result, a conductive channel in which an immense amount of current would be flowing is formed.

Separately, a 2-terminal switching device having a horizontal structure and including source and drain electrodes formed of conventional Cr and Au was fabricated for comparison with the two terminal fabricated above in accordance with FIGS. 3-7 under same conditions, and this device will be referred to as the 'comparison example device' hereinbelow.

Figure 11:
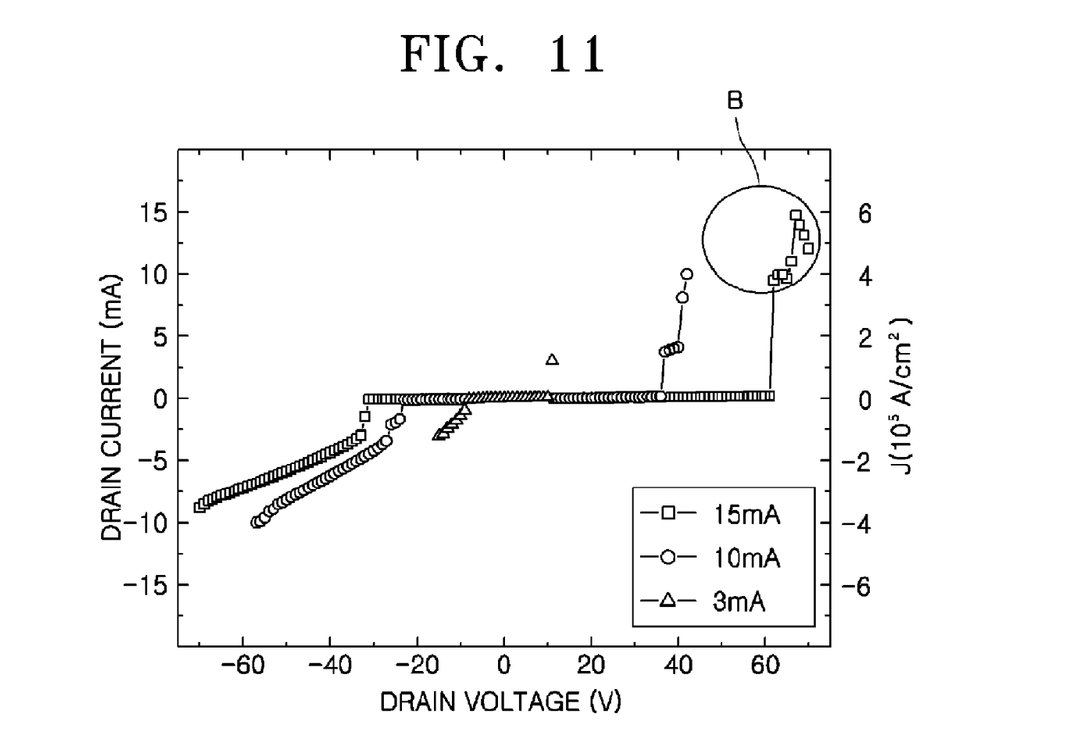
FIG. 11 is a graph for illustrating I-V characteristics of an abrupt metal-insulator transition device with respect to various drive currents.

FIG. 11 is a graph showing the I-V characteristics of an abrupt metal-insulator transition device with respect to various drive currents. Here, -Δ-, -○-, and -□- denote drive currents of 3 mA, 10 mA, and 15 mA, respectively. Referring to FIG. 11, in the case of the 'comparison example device' (i.e., the two terminal device above made with Cr and Au source/drain electrodes), the electrodes break down at the drive current of about 3 mA, and thus cannot be used. In the case of the two terminal device made in accordance with the present invention, the electrodes do not break down even at a drive current of 15 mA, and a current-jump occurs (reference character B). Thus, in a case where electrodes formed of stack layers of Ni, In, Mo, and Au are provided as in the present invention, the abrupt metal-insulator transition device can be embodied as a high power abrupt metal-insulator transition device that can be driven even at a high drive current.

Figure 12:
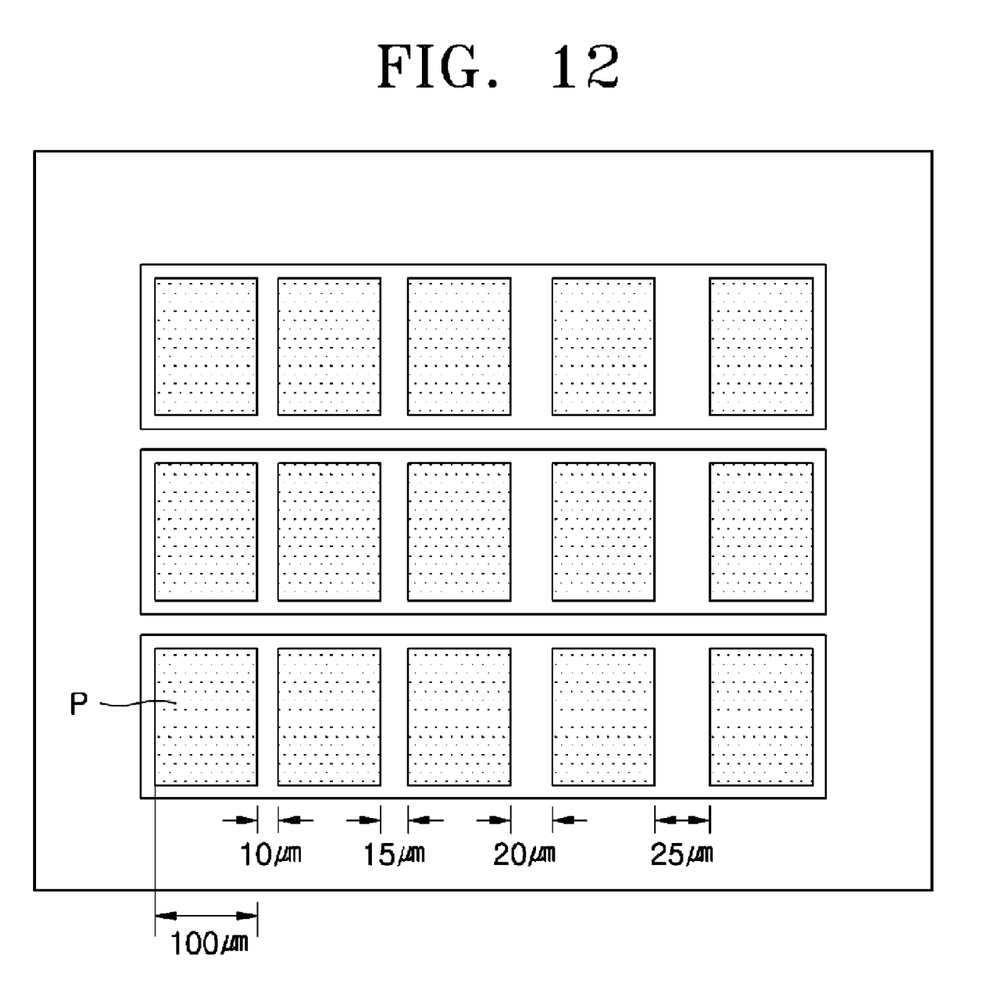
FIG. 12 is a view for illustrating transmission line measurement (TLM) patterns for measuring contact resistances of an abrupt metal-insulator transition device according to an embodiment of the present invention and an abrupt metal-insulator transition device as a comparison example.

FIG. 12 is a view illustrating transmission line model (TLM) patterns for measuring contact resistances of the abrupt metal-insulator transition device made according to the present invention and the 'comparison example device.' As shown in FIG. 12, TLM patterns P for measuring a contact resistance were fabricated so that the gap between any two TLM patterns P are either 10, 15, 20, or 25 μm, and the width of each TLM patterns P is 100 μm.

Figure 13:
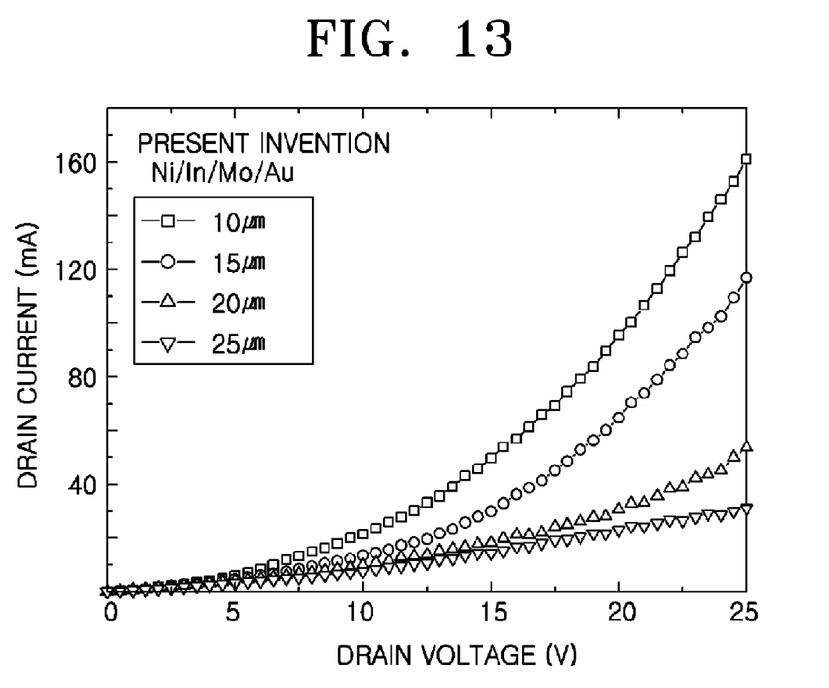
FIGS. 13 and 14 are graphs for illustrating a measured amount of a current flowing between two electrodes of each of the abrupt metal-insulator transition device of an embodiment of the present invention and the abrupt metal-insulator transition device as the comparison example.
Figure 14:
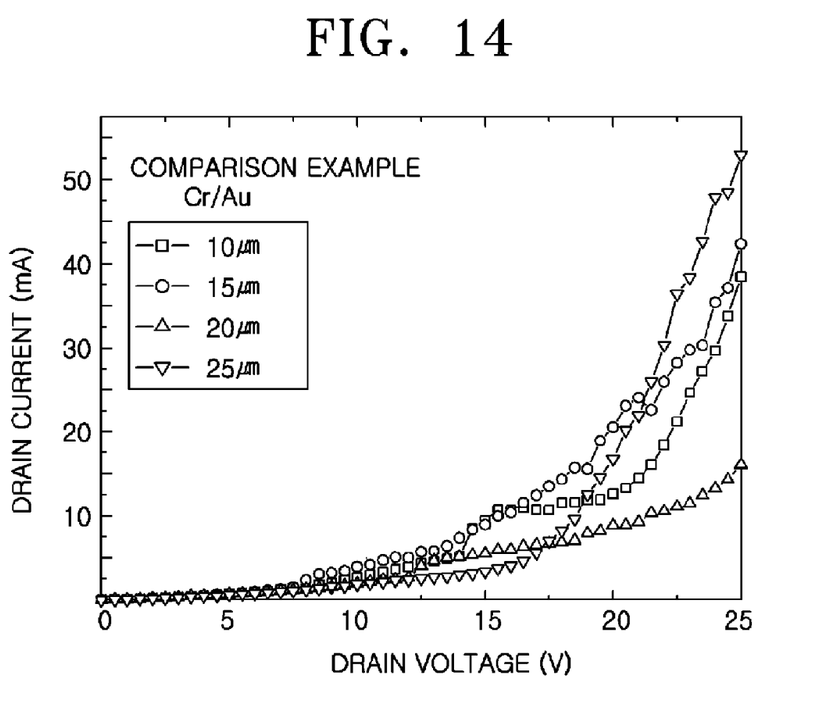

FIGS. 13 and 14 are graphs showing the amount of current flowing between two electrodes in each of the abrupt metal-transition device made according to the present invention and the 'comparison example device.' In the graphs, the symbols -□-, -○-, -Δ-, and -∇- denote cases where gaps between two TLM patterns P are 10, 15, 20, and 25 μm, respectively.

Referring to FIG. 13, in the case of the present invention, when a gap between TLM patterns is 10 μm (-□-), a drain current of 150 μA can be obtained at a drain voltage of 25V. However, referring to FIG. 14, in the case of the 'comparison example device,' when a gap between TLM patterns is 10 μm (-□-), a drain current of 50 μA can be obtained at a drain voltage of 25V. Thus, although the same voltage is applied, the current in the present invention is three times higher than the current in the 'comparison example device.' This is because Ni and In are used as the first metals contacting a GaAs layer (that is a channel layer) in the present invention so that a contact resistance between the electrodes and the surface of the GaAs layer is lowered more that the contact resistance which would exist if Cr and Au are used instead.

Figure 15:
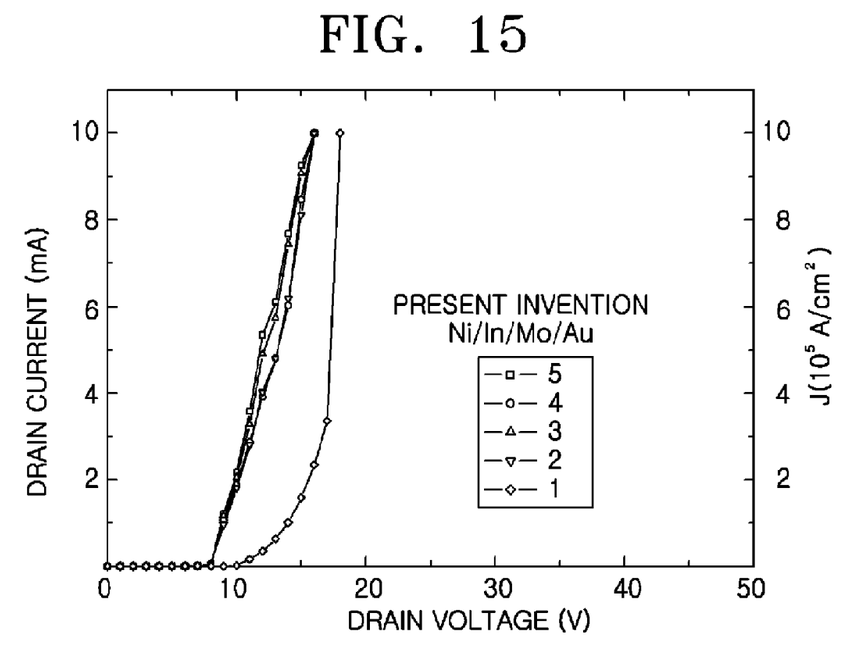
FIGS. 15 and 16 are graphs for illustrating evaluated reliabilities of the abrupt metal-insulator transition device of an embodiment of the present invention and the abrupt metal-insulator transition device as the comparison example.
Figure 16:
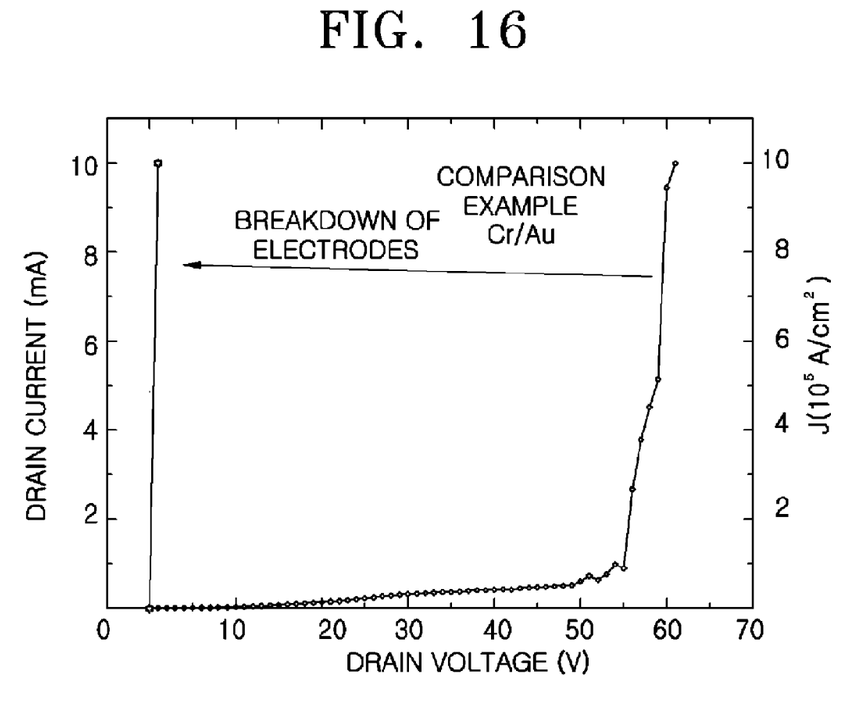
Figure 17:
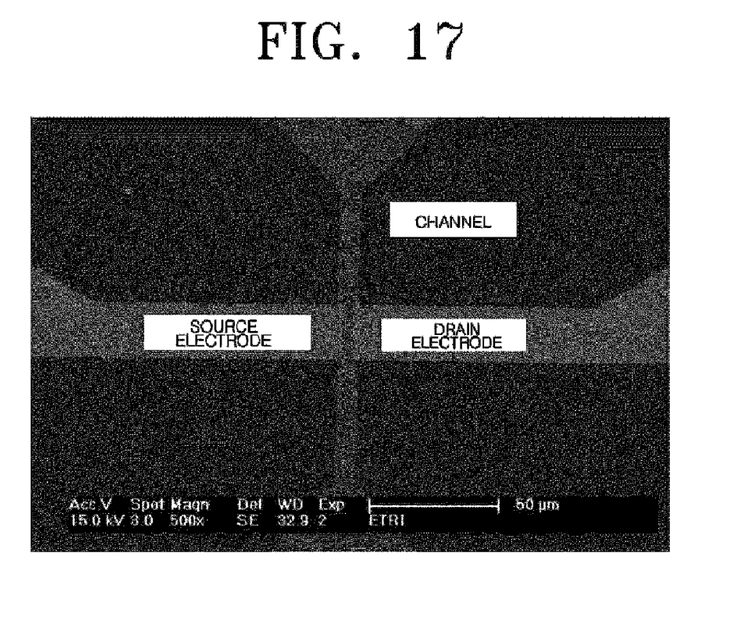
FIG. 17 is an SEM photo of electrode patterns photographed after five consecutive measurements of the abrupt metal-insulator transition device of an embodiment of the present invention as shown in FIG. 15.

FIGS. 15 and 16 are graphs showing evaluated reliabilities of the abrupt metal-insulator transition device made according to the present invention and the 'comparison example device.' In the case of the present invention, a current of about 5×105 A/cm2 flowed through the device and was measured several tens of times. However, the electrodes did not break down. FIG. 15 shows the results of five consecutive measurements of the current. Here, -566 -, -∇-, -△-, -○-, and -□- denote the results of one, two, three, four, and five time measurements. FIG. 17 is an SEM photo of electrode patterns photographed after five consecutive measurements of the abrupt metal-insulator transition device according to the present invention as shown in FIG. 15. Here, the electrodes do not break down due to the deterioration of the abrupt metal-insulator transition device.

However, in the case of the 'comparison example device,' the electrodes do break down, and a short-circuit has occurred twice due to their deterioration during the measurements of the abrupt metal-insulator transition device used to measure the data shown in FIG. 16. As described above, the abrupt metal-insulator transition device of the present invention has higher reliability than the 'comparison example device.' This is because the electrodes used in the present invention are formed of Mo, W, and the like.

Figure 18:
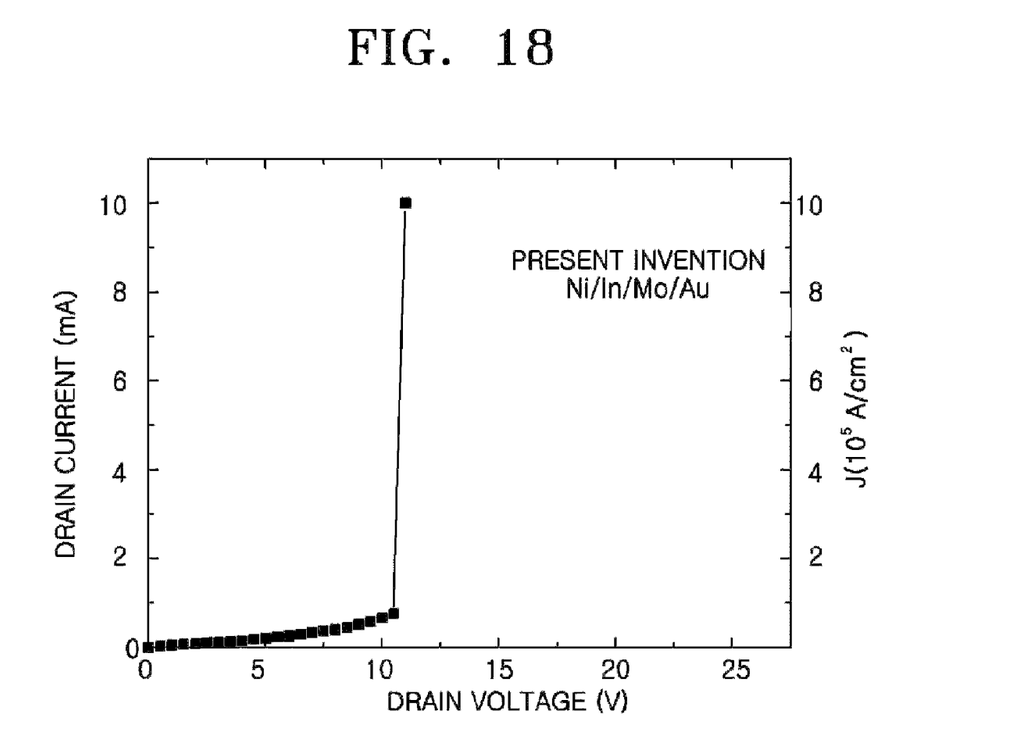
FIGS. 18 and 19 are graphs for illustrating operation characteristics of the abrupt metal-insulator transition device of an embodiment of the present invention and the metal-insulator transition device as the comparison example.
Figure 19:
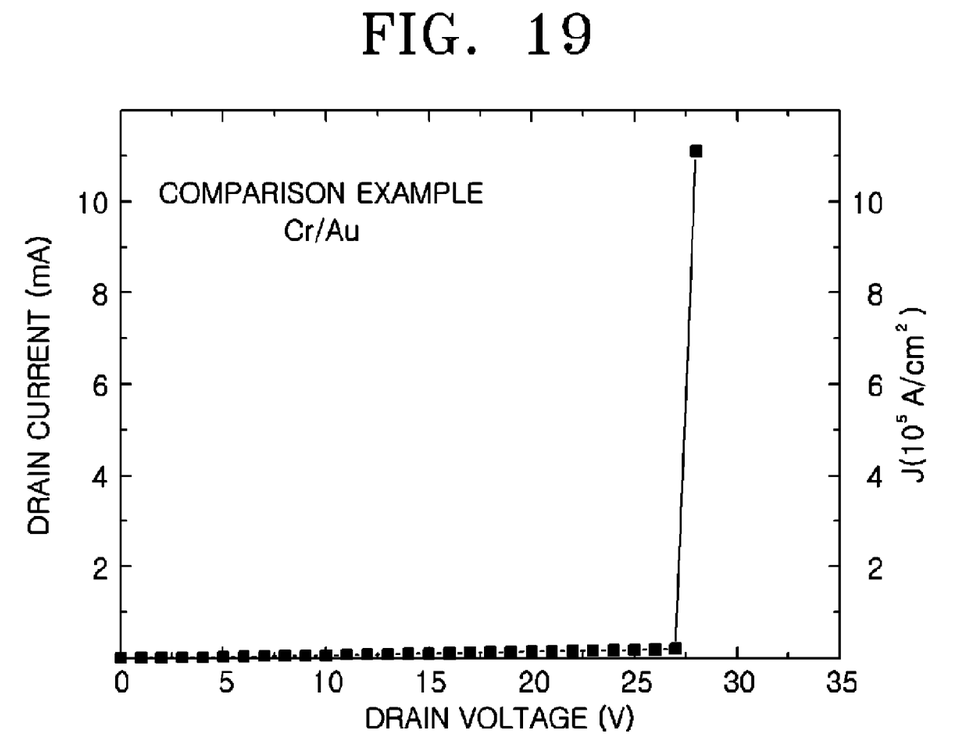

FIGS. 18 and 19 are graphs illustrating operation characteristics of the abrupt metal-insulator transition devices according to the present invention and the comparison example. As shown in FIG. 18, in the case of the present invention, a contact resistance is lowered so as to lower a turn-on voltage Vt to about 10.2V. However, as shown in FIG. 19, in the case of the comparison example, the turn-on voltage Vt is about 23.5V. Thus, in the case of the present invention, the turn-on voltage Vt may be lowered to be more than or equal to 10V. This means that a high efficient switching device with a low power consumption and high power can be realized.

The invention claimed is:

1. An abrupt metal-insulator transition device comprising:
    an abrupt metal-insulator transition material layer having an energy gap of less than or equal to 2 eV and holes within a hole level; and
    first and second electrodes contacting the abrupt metal-insulator transition material layer,
    wherein each of the first and second electrodes is formed by thermally treating a set of stacked layers comprising:
    a first layer formed on the abrupt metal-insulator transition material layer and comprising Ni or Cr;
    a second layer formed on the first layer and comprising In;
    a third layer formed on the second layer and comprising Mo or W; and
    a fourth layer formed on the third layer and comprising Au.

2. The abrupt metal-insulator transition device of claim 1 further comprising:
    an intermediate layer having a first band gap formed between (1) the first and second electrodes and (2) the abrupt metal-insulator transition material layer having a second band gap, wherein the first band gap is smaller than the second band gap.

3. The abrupt metal-insulator transition device of claim 1, wherein the first electrode is disposed on a lower surface of the abrupt metal-insulator transition material layer, and the second electrode is disposed on an upper surface of the abrupt metal-insulator transition material layer.

4. The abrupt metal-insulator transition device of claim 1, wherein the first electrode is disposed on a lower surface of the abrupt metal-insulator transition material layer, and the second electrode is disposed on an upper surface of the abrupt metal-insulator transition material layer.

5. The abrupt metal-insulator transition device of claim 4 further comprising:
    a gate insulating layer formed on the first and second electrodes; and
    a third electrode formed on the gate insulating layer and disposed over the abrupt metal-insulator transition material layer between the first and second electrodes.

6. The abrupt metal-insulator transition device of claim 5, wherein the third electrode is formed on the gate insulating layer by thermally treating another set of stacked layers comprising:
    a fifth layer formed on the gate insulating layer and comprising Ni or Cr;
    a sixth layer formed on the fifth layer and comprising In;
    a seventh layer formed on the sixth layer and comprising Mo or W; and
    an eighth layer formed on the seventh layer and comprising Au.

7. An abrupt metal-insulator transition device comprising:
    an abrupt metal-insulator transition material layer formed of GaAs; and
    first and second electrodes disposed on the abrupt metal-insulator transition material layer so as to face each other and to be spaced apart from each other, wherein each of the first and second electrodes is formed by thermally treating a set of stacked layers comprising:
    a first layer formed on the abrupt metal-insulator transition material layer and comprising Ni or Cr;
    a second layer formed on the first layer and comprising In;
    a third layer formed on the second layer and comprising Mo or W; and
    a fourth layer formed on the third layer and comprising Au.

8. The abrupt metal-insulator transition device of claim 7 further comprising:
    an intermediate layer formed of InGaAs between (1) the first and second electrodes and (2) the abrupt metal-insulator transition material layer.

9. A method of fabricating an abrupt metal-insulator transition device comprising:
    forming an abrupt metal-insulator transition material layer having an energy gap of less than or equal to 2 eV and holes within a hole level;
    forming each of first and second electrodes contacting the abrupt metal-insulator transition material layer by the substeps comprising:
    forming a first layer of Ni or Cr on the abrupt metal-insulator transition material layer;
    forming a second layer of In on the first layer;
    forming a third layer of Mo or W on the second layer; and
    forming a fourth layer of Au on the third layer; and
    thermally treating the stacked first, second, third, and fourth layers.

10. The method of claim 9, wherein the first, second, third, and fourth layers of the stack layers are formed using e-beam evaporation.

11. The method of claim 9, wherein the substeps further comprise: patterning the stack layers using a lift-off process.

12. The method of claim 9, wherein the abrupt metal-insulator transition material layer is formed of a GaAs layer.

13. The method of claim 12, wherein the GaAs layer is formed using a molecular beam epitaxy crystal growing method.

14. The method of claim 12, wherein the substeps further comprise:
   reacting the second layer and the abrupt metal-insulator transition material layer to form an intermediate layer of InGaAs between (1) the first and second electrodes and (2) the abrupt metal-insulator transition material layer.

15. The method of claim 12, wherein the substeps further comprise:
   reacting the second layer and the abrupt metal-insulator transition material layer to form an intermediate layer of InGaAs between (1) the first and second electrodes and (2) the abrupt metal-insulator transition material layer.

16. The method of claim 9, wherein the substeps further comprise:
   reacting the second layer and the abrupt metal-insulator transition material layer to form an intermediate layer between (1) the first and second electrodes and (2) the abrupt metal-insulator transition material layer, wherein the band gap of the intermediate layer is smaller than the band gap of the abrupt metal-insulator transition material layer.

17. The method of claim 9, wherein the first electrode is disposed on a lower surface of the abrupt metal-insulator transition material layer, and the second electrode is disposed on an upper surface of the abrupt metal-insulator transition material layer.

18. The method of claim 9, wherein the first and second electrodes are disposed on the abrupt metal-insulator transition material layer so as to face each other and to be spaced apart from each other.

19. The method of claim 18 further comprising:
   forming a gate insulating layer on the first and second electrodes; and
   forming a third electrode on the gate insulating layer so as to be disposed over the abrupt metal-insulator transition material layer and between the first and second electrodes.

20. The method of claim 19, wherein the forming of the third electrode comprises the substeps of:
   forming another set of stacked layers comprising:
   forming a fifth layer of Ni or Cr on the gate insulating layer;
   forming a sixth layer of In on the fifth layer;
   forming a seventh layer of Mo or W on the sixth layer;
   forming an eighth layer of Au on the seventh layer; and
   thermally treating the another set of stacked layers.

* * * * *